(12) United States Patent
Lee et al.

(10) Patent No.: US 8,174,073 B2
(45) Date of Patent: May 8, 2012

(54) INTEGRATED CIRCUIT STRUCTURES WITH MULTIPLE FINFETS

(75) Inventors: Tsung-Lin Lee, Hsinchu (TW); Chang-Yun Chang, Taipei (TW); Sheng-Da Liu, Hsinchu (TW); Fu-Liang Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 373 days.

(21) Appl. No.: 11/807,652

(22) Filed: May 30, 2007

(65) Prior Publication Data

US 2008/0296702 A1    Dec. 4, 2008

(51) Int. Cl.
*H01L 27/12* (2006.01)
(52) U.S. Cl. .................. 257/347; 257/288; 438/197
(58) Field of Classification Search .................. 257/347, 257/348, 288
See application file for complete search history.

(56) References Cited

U.S. PATENT DOCUMENTS

| | | | |
|---|---|---|---|
| 6,706,571 B1 | 3/2004 | Yu et al. | |
| 6,716,690 B1 | 4/2004 | Wang et al. | |
| 6,835,618 B1 | 12/2004 | Dakshina-Murthy et al. | |
| 6,858,478 B2 | 2/2005 | Chau et al. | |
| 7,005,330 B2 | 2/2006 | Yeo et al. | |
| 7,074,656 B2 | 7/2006 | Yeo et al. | |
| 7,180,134 B2 | 2/2007 | Yang et al. | |
| 7,190,050 B2 | 3/2007 | King et al. | |
| 7,247,887 B2 | 7/2007 | King et al. | |
| 7,265,008 B2 | 9/2007 | King et al. | |
| 7,361,958 B2* | 4/2008 | Brask et al. | 257/369 |
| 7,508,031 B2 | 3/2009 | Liu et al. | |
| 7,528,465 B2 | 5/2009 | King et al. | |
| 7,605,449 B2 | 10/2009 | Liu et al. | |
| 2001/0038131 A1* | 11/2001 | Hu et al. | 257/384 |
| 2004/0038436 A1* | 2/2004 | Mori et al. | 438/17 |
| 2004/0108523 A1 | 6/2004 | Chen et al. | |
| 2005/0153490 A1 | 7/2005 | Yoon et al. | |
| 2005/0167750 A1* | 8/2005 | Yang et al. | 257/347 |
| 2005/0218438 A1* | 10/2005 | Lindert et al. | 257/296 |

(Continued)

FOREIGN PATENT DOCUMENTS

CN    1507057 A    6/2004

OTHER PUBLICATIONS

Kawasaki, H., et al., "Embedded Bulk FinFET SRAM Cell Technology with Planar FET Peripheral Circuit for *hp*32 nm node and beyond," 2006 Symposium on VLSI Technology Digest of Technical Papers, 2006, 2 pages, IEEE.

*Primary Examiner* — Thao Le
*Assistant Examiner* — Geoffrey Ida
(74) *Attorney, Agent, or Firm* — Slater & Matsil, L.L.P.

(57) ABSTRACT

A semiconductor structure includes a semiconductor substrate; and a first Fin field-effect transistor (FinFET) and a second FinFET at a surface of the semiconductor substrate. The first FinFET includes a first fin; and a first gate electrode over a top surface and sidewalls of the first fin. The second FinFET includes a second fin spaced apart from the first fin by a fin space; and a second gate electrode over a top surface and sidewalls of the second fin. The second gate electrode is electrically disconnected from the first gate electrode. The first and the second gate electrodes have a gate height greater than about one half of the fin space.

3 Claims, 6 Drawing Sheets

U.S. PATENT DOCUMENTS

| | | |
|---|---|---|
| 2007/0102756 A1 | 5/2007 | Lojek |
| 2007/0111419 A1* | 5/2007 | Doyle et al. .................. 438/197 |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0170053 A1 | 7/2008 | Yeo et al. |
| 2008/0258228 A1* | 10/2008 | Chuang et al. ................. 257/369 |
| 2008/0290470 A1 | 11/2008 | King et al. |
| 2008/0296632 A1 | 12/2008 | Moroz et al. |
| 2009/0181477 A1 | 7/2009 | King et al. |

* cited by examiner

INTEGRATED CIRCUIT STRUCTURES WITH MULTIPLE FINFETS

TECHNICAL FIELD

This invention relates generally to semiconductor devices, and particularly to structures and formation methods of Fin field-effect transistors (FinFET).

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing sizes of semiconductor devices. Fin field-effect transistors (FinFET) are thus formed. FIG. 1 illustrates a perspective view of a conventional FinFET. Fin 4 is formed as a vertical silicon fin extending above substrate 2, and is used to form source and drain regions 6 and a channel region therebetween (not shown). A vertical gate 8 intersects the channel region of fin 4. While not shown in FIG. 1, a gate dielectric separates the channel region from vertical gate 8. FIG. 1 also illustrates oxide layer 18, and insulating sidewall spacers 12 and 14 formed on source and drain regions 6 and vertical gate 8, respectively. The ends of fin 4 receive source and drain doping implants that make these portions of fin 4 conductive.

Typically, a semiconductor chip contains a plurality of FinFETs. Problems arise when FinFETs are formed adjacent to each other. FIG. 2 illustrates a cross-sectional view of an intermediate stage in the manufacturing of two FinFETs. Fins 20 and 22 are adjacent to each other with shallow trench isolation (STI) region 24 therebetween. Gate electrode layer 26 is then blanket formed. Since fins 20 and 22 are higher than STI region 24, gate electrode layer 26 is not flat, and portion $26_1$, which is directly over STI region 24, is lower than portions $26_2$, which are directly over fins 20 and 22.

Referring to FIG. 3, for the patterning of gate electrodes of the respective FinFETs, a substantially flat photoresist 28 is applied. After the patterning, photoresist portions $28_2$ are left over fins 20 and 22 to protect the underlying gate electrode portions $26_2$. Due to the different thicknesses of photoresist 28, which is caused by the topography of the top surface of gate electrode layer 26, it is likely that not all of the undesirable photoresist 28 is removed. Adversely, photoresist portion $28_1$ may be left un-removed. In the subsequent etching of gate electrode layer 26, residue portion $26_1$ of gate electrode layer 26 is adversely not etched. As a result, the gates of the resulting FinFETs may be shorted, causing circuit failure.

What are needed in the art, therefore, are formation methods and structures thereof that incorporate FinFETs to take advantage of the benefits associated with the increased drive currents while at the same time overcoming the deficiencies of the prior art.

SUMMARY OF THE INVENTION

In accordance with one aspect of the present invention, a semiconductor structure includes a semiconductor substrate; and a first Fin field-effect transistor (FinFET) and a second FinFET at a surface of the semiconductor substrate. The first FinFET includes a first fin; and a first gate electrode over a top surface and sidewalls of the first fin. The second FinFET includes a second fin spaced apart from the first fin by a fin space; and a second gate electrode over a top surface and sidewalls of the second fin. The second gate electrode is electrically disconnected from the first gate electrode. The first and the second gate electrodes have a gate height greater than about one half of the fin space.

In accordance with another aspect of the present invention, a semiconductor structure includes a semiconductor substrate; an insulating region in the semiconductor substrate; a first active region and a second active region on opposite sides of the insulating region; and a first fin and a second fin on the first and the second active regions, respectively, wherein the first and the second fins have a fin space therebetween, and have a fin height. The semiconductor structure further includes a first and a second gate dielectric on sidewalls and top surfaces of the first and the second fins, respectively; and a first and a second gate electrode on the first and the second gate dielectrics, respectively. The first and the second gate electrodes have a gate height, and wherein the fin space is less than at least one of two times of the gate height and two times of the fin height; a first source region and a first drain region on opposite sides of the first fin; and a second source region and a second drain region on opposite sides of the second fin.

In accordance with yet another aspect of the present invention, a semiconductor structure includes a semiconductor substrate; and a first and a second FinFET at a surface of the semiconductor substrate. The first FinFET includes a first fin; and a first gate electrode over a top surface and sidewalls of the first fin. The second FinFET includes a second fin spaced apart from the first fin by a fin space; and a second gate electrode over a top surface and sidewalls of the second fin. The first and the second gate electrodes have a gate height greater than about one half of the fin space, wherein the fin space is less than about 80 nm.

In accordance with yet another aspect of the present invention, a method of forming a semiconductor structure includes providing a substrate; forming a first Fin field-effect transistor (FinFET) and a second FinFET at a surface of the substrate. The step of forming the first FinFET includes forming a first fin; and forming a first gate electrode over a top surface and sidewalls of the first fin. The step of forming the second FinFET includes forming a second fin spaced apart from the first fin by a fin space; and forming a second gate electrode over a top surface and sidewalls of the second fin. The first and the second gate electrodes have gate heights, and the fin space is less than about two times of each of the gate heights.

In accordance with yet another aspect of the present invention, a method of forming a semiconductor structure includes providing a semiconductor substrate; forming a first, a second and a third insulating region in the semiconductor substrate; forming a first fin horizontally between the first and the second insulating regions; forming a second fin horizontally between the second and the third insulating regions, wherein the first and the second fins are spaced apart by a fin space; forming a gate dielectric layer over the first and the second fins and the first, the second and the third insulating regions; forming a gate electrode layer over the gate dielectric layer, wherein a thickness of portions of the gate electrode layer directly over the first and the second fins have a gate height greater than about a half of the fin space; and patterning the gate electrode layer and the gate dielectric layer to form a first and a second gate dielectric over the first and the second fins, respectively, and a first and a second gate electrode over the first and the second gate dielectrics, respectively, wherein the first and the second gate electrodes are electrically disconnected.

By reducing the fin space between fins of the neighboring FinFETs, the gate electrode residue problem resulted from the un-removed photoresist is reduced, and possibly eliminated.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 4A:
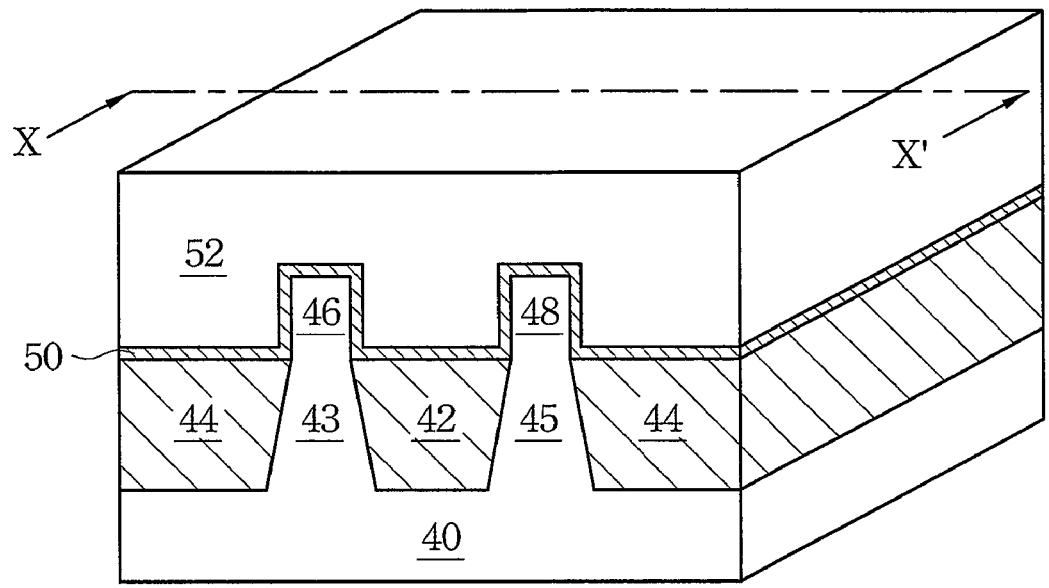
FIGS. 4A through 7 are perspective views and cross-sectional views of intermediate stages in the manufacturing of an embodiment of the present invention.

FIG. 4A illustrates a perspective view of an intermediate stage in the formation of an embodiment of the present invention. A portion of substrate 40 is illustrated. Preferably, substrate 40 comprises bulk silicon. Alternatively, substrate 40 comprises bulk SiGe or other semiconductor materials. Shallow trench isolation (STI) regions 42 and 44 are formed on substrate 40 to isolate device regions. As is known in the art, STI regions 42 and 44 may be formed by etching substrate 40 to form recesses, and then filling the recesses with dielectric materials, such as high-density plasma (HDP) oxides, TEOS oxides, and the like.

STI regions 42 and 44 define active regions 43 and 45. Fin 46 is located on active region 43, while fin 48 is located on active region 45. Each of the fins 46 and 48 is used for forming a Fin field-effect transistor (FinFET). As is known in the art, fins 46 and 48 may be formed by recessing the top surfaces of substrate 40 and leaving fins 46 and 48, or by epitaxially growing fins 46 and 48 on active regions 43 and 45, respectively. Preferably, the channel portions of the resulting FinFETs are doped to an impurity concentration of less than about 3 E18/cm$^3$. For p-type FinFETs, the impurity is of n-type, while for n-type FinFETs, the impurity is of p-type.

Gate dielectric layer 50 is blanket formed, covering the top surface surfaces and sidewalls of fins 46 and 48. Gate dielectric layer 50 preferably includes commonly used dielectric materials such as oxides, nitrides, oxynitrides, high-K dielectrics such as $Ta_2O_5$, $Al_2O_3$, HfO, $Ta_2O_5$, $SiTiO_3$, HfSiO, HfSiON, ZrSiON, and combinations thereof.

Gate electrode layer 52 is formed on gate dielectric layer 50. Gate electrode layer 52 may be formed of polysilicon. Alternatively, gate electrode layer 52 is formed of other commonly used conductive materials, including metals such as Ni, Ti, Ta and Hf and combinations thereof, metal silicides such as NiSi, MoSi, HfSi, and combinations thereof, and metal nitrides such as TiN, TaN, HfN, HFAlN, MoN, NiAlN, and combinations thereof.

Figure 4B:
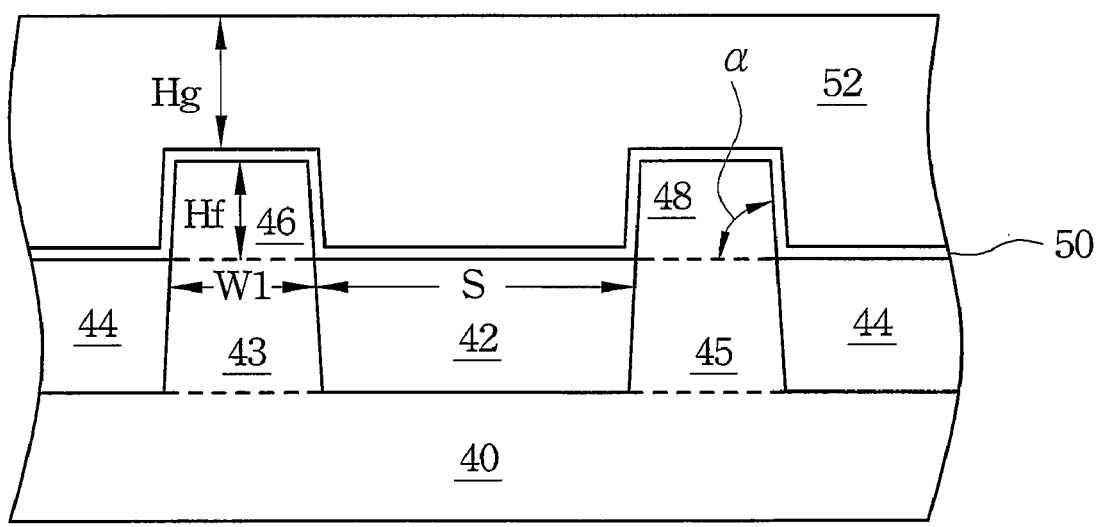

FIG. 4B illustrates a cross-sectional view of the structure shown in FIG. 4A, wherein the cross-sectional view is taken along a vertical plane crossing line X-X'. In the preferred embodiment, fins 46 and 48 have substantially vertical sidewalls, and the tilt angle α of the sidewall is greater than about 87 degrees, and more preferably substantially close to 90 degrees. It is noted tilt angle α is preferably defined as the angle between sidewalls of fins 46 and 48 and the top surface of STI regions 42 and 44, as is shown in FIG. 4B, in which fins 46 and 48 are the portions of the semiconductor material higher than STI regions 42 and 44. Alternatively, fins 46 and 48 have an undercut profile with the upper portions having greater widths than the lower portions. In other words, tilt angle α is slightly greater than about 90 degrees. The fin aspect ratio $H_f/W1$ is preferably greater than about 0.7, wherein $H_f$ is the fin heights of fins 46 and 48, and W1 is the widths of fins 46 and 48.

Figure 1:
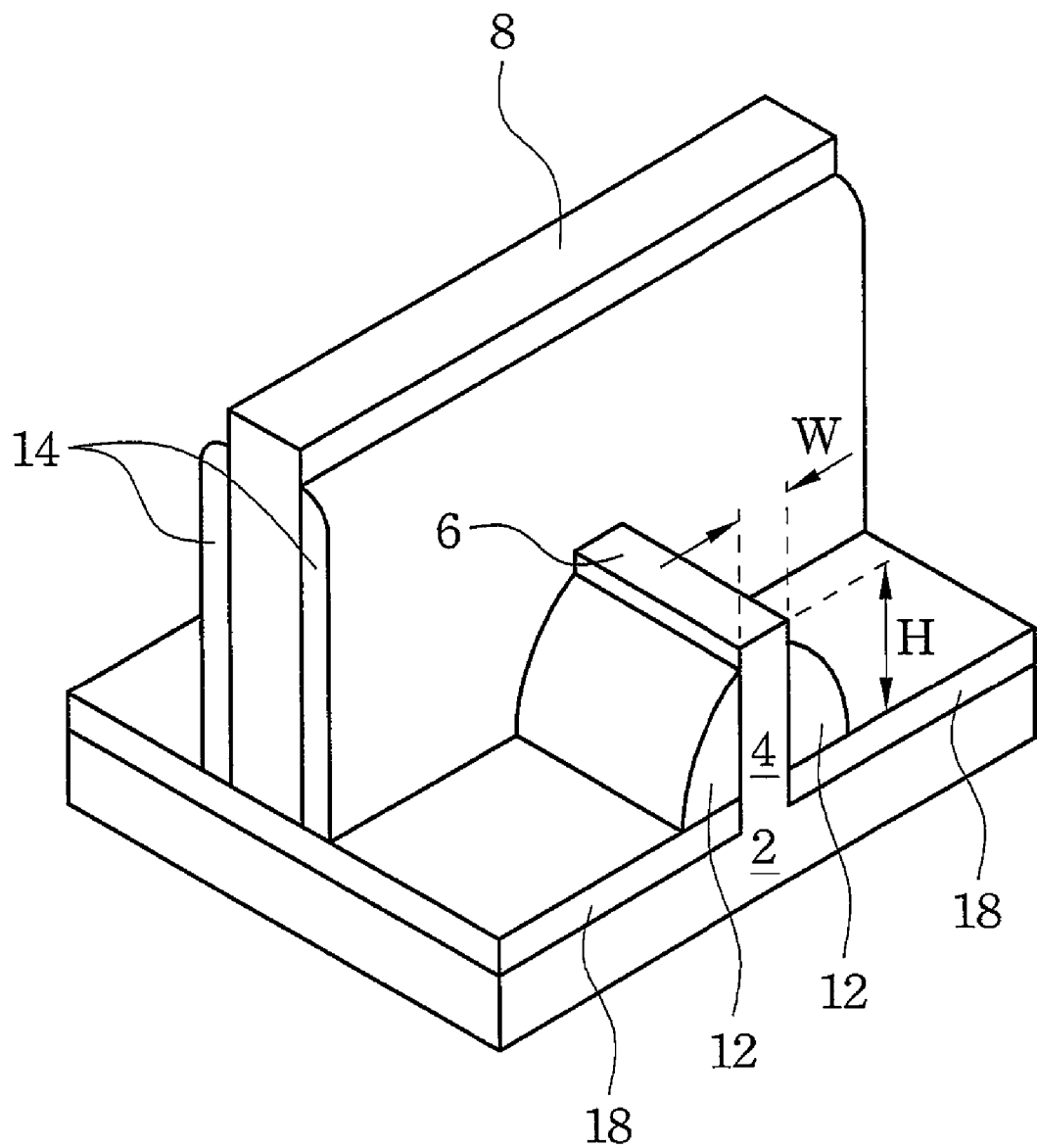
FIG. 1 illustrates a perspective view of a conventional fin Field-effect transistor (FinFET)
Figure 2:
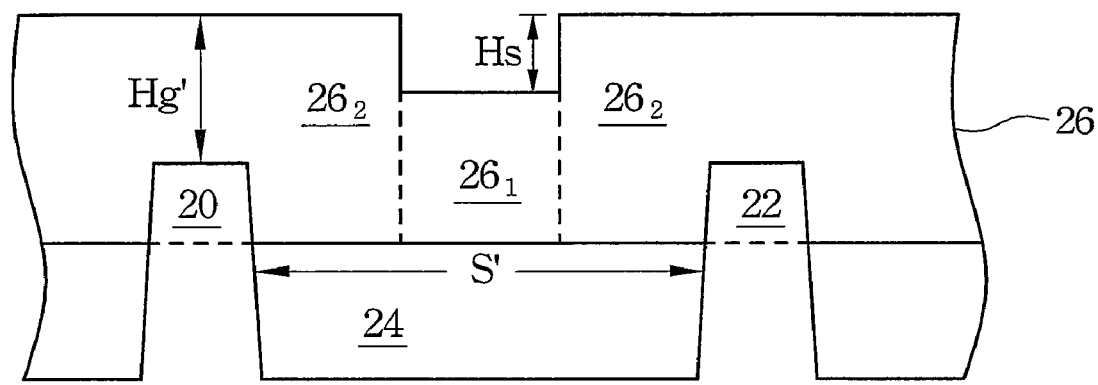
FIGS. 2 and 3 are cross-sectional views of intermediate stages in the manufacturing of a conventional semiconductor structure including two FinFETs.
Figure 3:
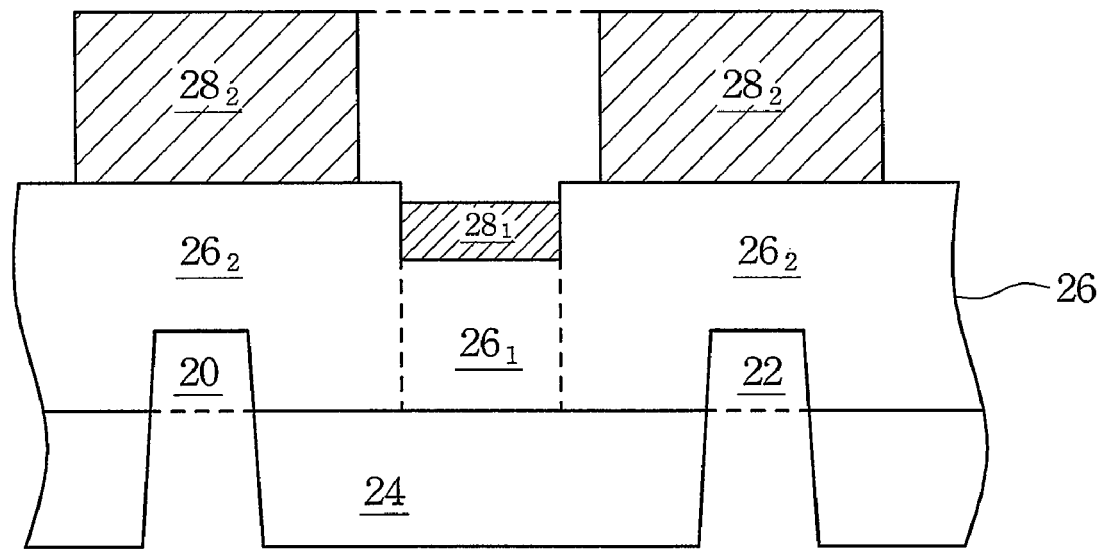

In an exemplary embodiment, fin height $H_f$ is greater than about 25 nm. It is realized, however, that the desirable fin height $H_f$ is related to the formation technology, and will be changed with the scaling of integrated circuits. The distance between fins 46 and 48 is referred to as fin space S. The vertical distance between the top surfaces of fins 46 and 48 to the top surface of gate electrode layer 52 is referred to as gate height $H_g$, which is also the gate height of the resulting FinFETs. In the preferred embodiment, fin space S is less than about two times of gate height $H_g$. More preferably, a ratio of fin space S to gate height $H_g$ is between about 1.5 and about 1.9. Advantageously, with a small fin space S, gate electrode layer 52 has a reduced step height, wherein the step height is the height difference between the top surfaces of the portion of gate electrode layer 52 directly over fins 46/48 and the portion directly over STI 42. The step height is reduced, and may even by substantially eliminated with small fin space S. The topography of gate electrode layer 52 may be further reduced by making gate height $H_g$ greater than fin height $H_f$. As a comparison, FIG. 2 illustrates a prior art structure, wherein the fin space S' is substantially greater than about two times the gate height $H_g'$. In this case, the top surface of gate electrode layer 26 follows the topography of the underlying structure, and thus step height H, is resulted. This will cause gate electrode residue to be formed, which may short the gate electrodes subsequently formed on fins 46 and 48. Accordingly, a planarization process, such as an etch-back process, may be needed to planarize the top surface of gate electrode layer 26 before it is patterned. However, in the embodiment as shown in FIG. 4B, since the top surface of gate electrode layer 52 is substantially planar, no additional planarization process is needed.

Fin space S may be about, and even slightly less than, two times fin height $H_f$. In 45 nm technology, the minimum fin space S is preferably close to, or slightly less than, about 80 nm, The significance of such a preference is that the area usage may reach 100 percent or higher. For example, in the illustrated area in FIG. 4B, each FinFET occupies a width of (S+W1), assuming the STI region 44 on the left side of fin 46 and the STI region 44 on the right side of fin 48 all have width S/2. Considering the sidewalls and the top surface of each of the fins 46 and 48 can both conduct current, the channel width of each of the FinFETs is roughly ($2H_f+W1$). The area usage, which is the ratio of the area that can be used to conduct the current in a FinFET relative to the chip area occupied by the FinFET, is thus ($2H_f+W1$)/(S+W1). If fin space S is less than $2H_f$, The area usage is greater than 100 percent. Therefore, reducing fin space S also has the benefit of increasing the area usage. However, space S is necessary for device isolation, it can't be scaled down at will.

Figure 5A:
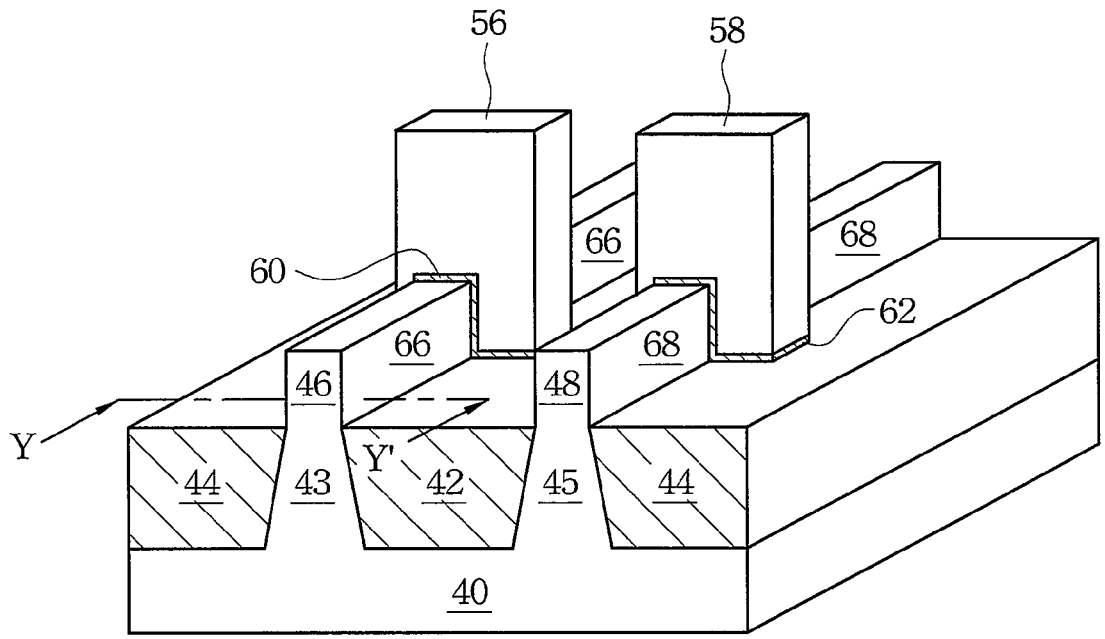

Next, gate electrode layer 52 and gate dielectric layer 50 are patterned, forming separate gate electrodes 56 and 58, and gate dielectrics 60 and 62, respectively. A perspective view of the resulting structure is shown in FIG. 5A. Due to the fact that the top surface of gate electrode layer 52 (refer to FIGS. 4A and 4B) is substantially flat, the lithograph of gate electrode layer 52 can be cleanly performed, and no gate electrode residue is left to interconnect gate electrodes 56 and 58.

Figure 5B:
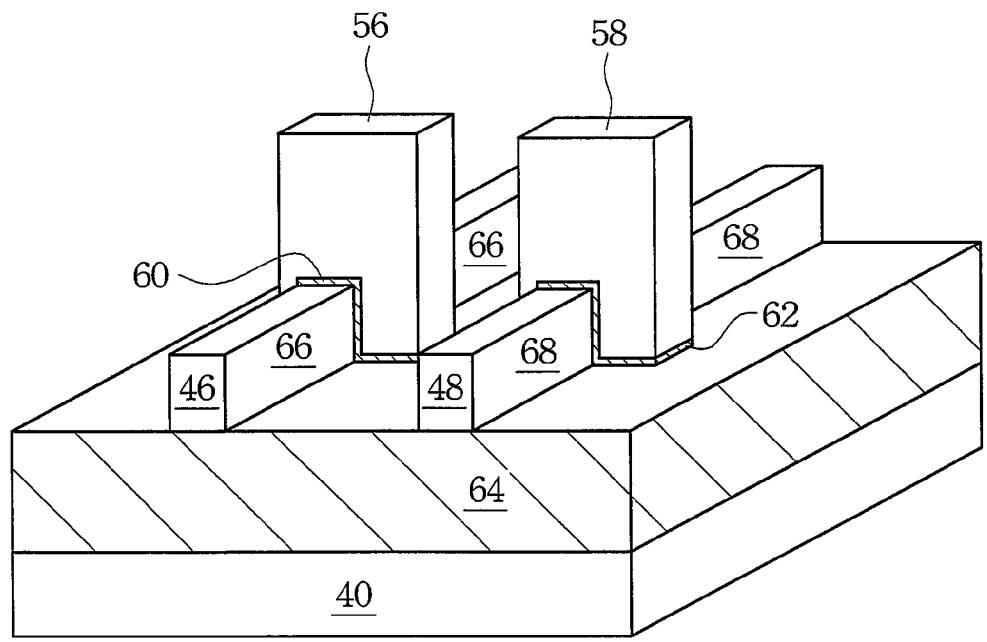

FIG. 5B illustrates an embodiment formed on a silicon-on-insulator (SOI) structure, wherein fins 46 and 48 are isolated from each other by buried oxide layer 64. One skilled in the art will realize the respective formation processes.

Figure 6A:
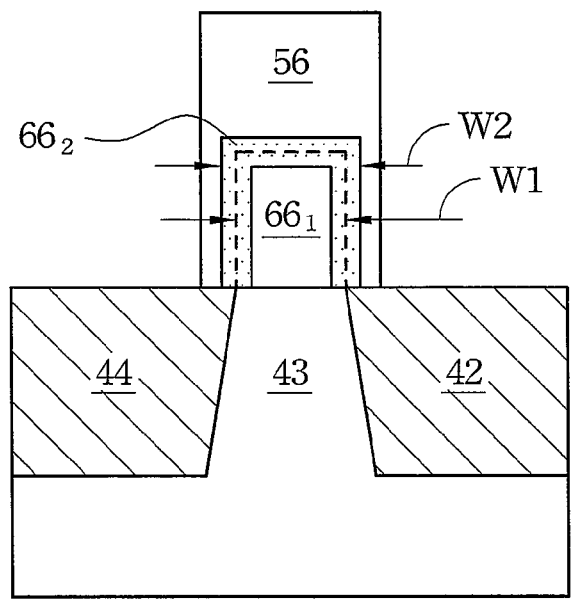
Figure 6B:
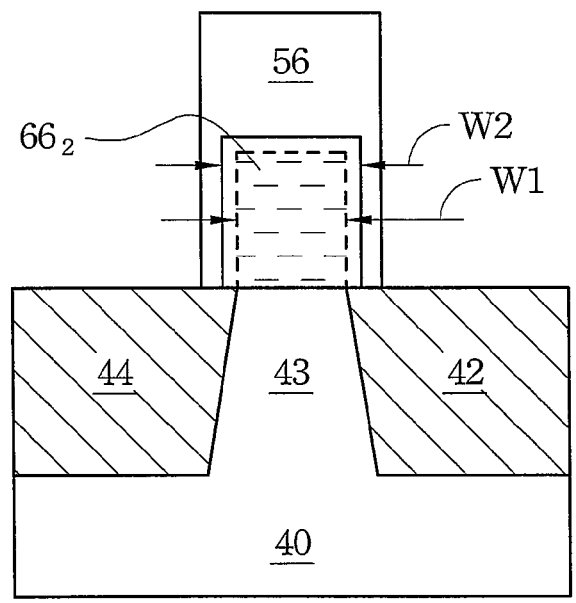
Figure 6C:
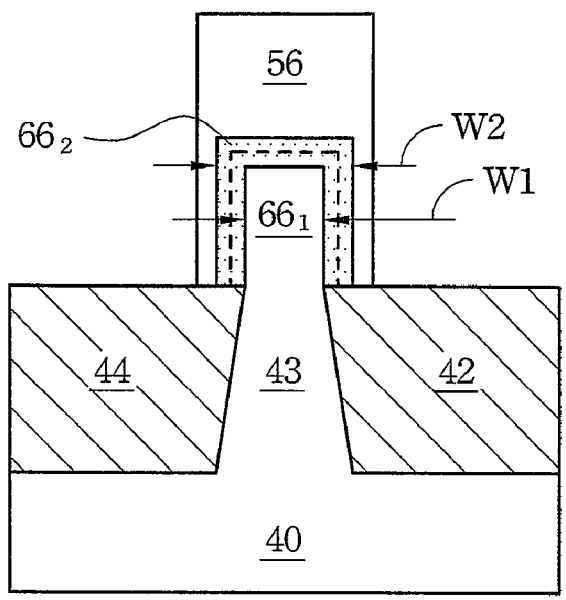

In subsequent steps, source/drain regions 66 and 68 are formed. FIGS. 6A, 6B and 6C illustrate cross-sectional views of the structure shown in FIG. 5A, wherein the cross-sectional view is taken along a vertical plane crossing line Y-Y' in FIG. 5A. For simplicity, only one FinFET is shown. Please note gate electrode 56 is also shown even though it is not in the same plane as source/drain region 66. As is known in the art, source/drain regions 66 and 68 may each be formed by implanting a p-type or an n-type impurity, depending on the desired conductivity type of the FinFETs. Alternatively, stressors may be formed to apply a desirable stress to the channel region of the resulting FinFET. As is known in the art, for an n-type FinFET, the source/drain regions 66 and/or 68 may include SiC stressors. For a p-type FinFET, the source/drain regions 66 and/or 68 may include SiGe stressors. The process steps for forming the stressors are well known in the art, and thus are not repeated herein.

In the preferred embodiment, the widths W2 of the source/drain regions are preferably increased to greater than the original fin width W1. With the increasing downscaling of width W2 of FinFET devices, the widths of the source/drain regions 66 and 68 become increasingly smaller. As a result, it is increasingly difficult to align contact plugs (not shown) accurately on the source/drain regions. In addition, the contact areas between the contact plugs and the respective source/drain regions become too small, resulting in increased contact resistances. Such problems may be solved by increasing widths W2 of source/drain regions 66 and 68, as shown in FIGS. 6A, 6B and 6C.

In FIG. 6A, the portions of the original fin 46 that are not covered by gate electrode 56 are recessed. The dashed line indicates the original size of fin 46 (refer to FIG. 4A). A semiconductor material such as SiC or SiGe, depending on the type of the FinFET device, is grown on the recessed fin. As a result, source/drain region 66 includes an original fin portion $66_1$ and an epitaxy portion $66_2$. The final width W2 of resulting source/drain region 66 is greater than width W1 of the original fin 46. In FIG. 6B, the original portion of fin 46 not covered by gate electrode 46 is substantially fully removed. Accordingly, source/drain region 66 only includes the epitaxy portion $66_2$. In FIG. 6C, the original fin portion $66_1$ is not recessed, and a layer of semiconductor material $66_2$ is grown on the original fin portion $66_1$.

Figure 7:
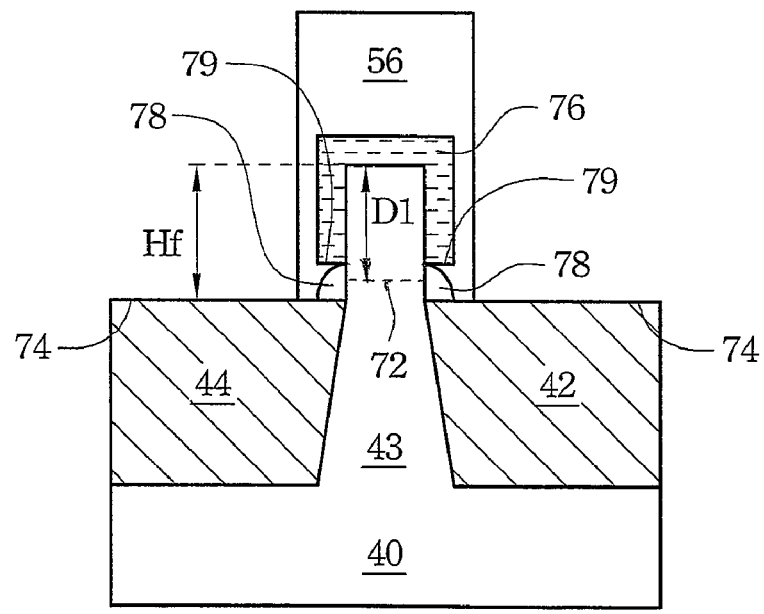

To effectively control leakage currents, it is preferable that the junction depth is less than the fin height. An exemplary embodiment is shown in FIG. 7, which is a cross-sectional view of source/drain region 66 after the formation of silicide region 76. The cross-sectional view is taken along a same plane as in FIGS. 6A through 6C. In FIG. 7, at least for a portion of source/drain region 66 close to gate electrode 46, the bottom 72 of the source drain junction is higher than the top surfaces 74 of STI regions 42 and 44. In other words, depth D1 of the junction is lower than the height $H_f$ of fin 46 (also refer to FIG. 4A). Accordingly, gate electrode 56 has effective control to the channel region, and thus leakage current is limited. It is to be noted that such a preference applies only to FinFETs formed on bulk substrates, not to FinFETs formed on SOI structures.

In subsequent process steps, silicide region 76 is formed. It is preferable that silicide region 76 has bottom edges 79 higher than junction 72. This will advantageously eliminate the Schottky leakage, which would occur if silicide region 76 has a bottom lower than the bottom surface 72 of the source/drain junction, and hence forming Schottky junctions between silicide region 76 and the portion of fin 46 below the source/drain junction. Such preference may be implemented by forming small spacers 78 on the sidewall of fin 46 (marked in FIG. 5A), and then performing the silicidation process. As shown in FIG. 7, spacers 78 have inner edges in contact with fin 46 (marked in FIG. 5A), and outer edges opposite to the respective inner edges. The outer edges of spacers 78 may be curved.

Next, a contact etch stop layer (CESL, not shown) is blanket formed. Preferably, for a p-type FinFET, the CESL applies a compressive stress to the channel region, and for an n-type FinFET, the CESL applies a tensile stress to the channel region. The formation of CESL is well known in the art, and thus is not repeated herein.

The embodiments of the present invention have several advantageous features. First, the gate electrode residue problem is resolved without additional cost. In addition, area usage is increased. With the topography of the gate electrode layer reduced, the uniformity of the resulting devices on a chip/wafer is improved. These improvements further cause the improvement in the reliability of integrated circuits having FinFETs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a semiconductor substrate;
   Shallow Trench Isolation (STI) regions at a surface of the semiconductor substrate, wherein the STI regions comprise a flat top surface;
   a semiconductor strip between opposite sidewalls of the STI regions, wherein a portion of the semiconductor strip over the flat top surface of the STI regions forms a semiconductor fin, wherein the semiconductor fin forms a channel region of a Fin field-effect transistor (FinFET), and wherein the semiconductor strip is connected to the semiconductor substrate to form a continuous semiconductor region;
   a gate dielectric on sidewalls and a top surface of the semiconductor fin;
   a gate electrode on the gate dielectric;

a source/drain region of the FinFET connected to an end of the semiconductor fin, wherein the source/drain region has a source/drain junction; and a source/drain silicide region on sidewalls and a top surface of the source/drain region, wherein the source/drain junction is higher than the flat top surface of the STI regions a spacer vertically between the source/drain silicide region and the flat top surface of the STI region, wherein the spacer comprises an inner edge adjoining the semiconductor fin, and a curved outer edge opposite the inner edge.

2. The device of claim 1, wherein one of the STI regions underlying and in contact with the spacer extends from a portion substantially aligned to the inner edge of the spacer to a portion beyond the outer edge of the spacer.

3. The device of claim 1, wherein the spacer comprises:
 a top end adjoining a bottom end of the source/drain silicide region; and
 a bottom end adjoining the flat top surface of the STI regions.

* * * * *